United States Patent
Ren et al.

(10) Patent No.: US 9,306,145 B2
(45) Date of Patent: Apr. 5, 2016

(54) METHODS OF SYNTHESIZING THERMOELECTRIC MATERIALS

(71) Applicants: Zhifeng Ren, Newton, MA (US); Shuo Chen, Newton, MA (US); Wei-Shu Liu, Brighton, MA (US); Hengzhi Wang, West Roxbury, MA (US); Hui Wang, Brookline, MA (US); Bo Yu, West Roxbury, MA (US); Gang Chen, Carlisle, MA (US)

(72) Inventors: Zhifeng Ren, Newton, MA (US); Shuo Chen, Newton, MA (US); Wei-Shu Liu, Brighton, MA (US); Hengzhi Wang, West Roxbury, MA (US); Hui Wang, Brookline, MA (US); Bo Yu, West Roxbury, MA (US); Gang Chen, Carlisle, MA (US)

(73) Assignees: The Trustees of Boston College, Chestnut Hill, MA (US); Massachusetts Institute of Technology, Cambridge, MA (US)

( * ) Notice: Subject to any disclaimer, the term of this patent is extended or adjusted under 35 U.S.C. 154(b) by 464 days.

(21) Appl. No.: 13/788,932

(22) Filed: Mar. 7, 2013

(65) Prior Publication Data

US 2013/0234375 A1    Sep. 12, 2013

Related U.S. Application Data

(60) Provisional application No. 61/608,999, filed on Mar. 9, 2012.

(51) Int. Cl.
*H01L 35/16* (2006.01)
*H01L 35/34* (2006.01)
(Continued)

(52) U.S. Cl.
CPC .............. *H01L 35/34* (2013.01); *C01B 19/007* (2013.01); *C04B 35/547* (2013.01); *C04B 35/62615* (2013.01); *C04B 35/645* (2013.01); *H01L 35/26* (2013.01); *C01P 2002/72* (2013.01); *C01P 2002/77* (2013.01); *C01P 2004/03* (2013.01); *C01P 2004/04* (2013.01); *C01P 2004/61* (2013.01); *C01P 2006/40* (2013.01); *C04B 2235/40* (2013.01); *C04B 2235/404* (2013.01); *C04B 2235/405* (2013.01);
(Continued)

(58) Field of Classification Search
CPC ......... H01L 35/15; H01L 35/26; H01L 35/34; C01B 19/007; C01P 2006/40; C04B 35/547; C04B 35/62615; C04B 35/645
USPC ......... 419/10, 23, 33, 48; 252/62.3 T, 62.3 S, 252/62.3 V; 264/614; 438/54; 420/579; 136/238
See application file for complete search history.

(56) References Cited

U.S. PATENT DOCUMENTS 2,957,937 A    10/1960    Jensen et al.
3,228,805 A    1/1966    Waseleski et al.
(Continued)

OTHER PUBLICATIONS

Alekseeva, G.T., et al., "Row of defects in acceptor doping of PbTe-type semiconductors with group I elements", Sov. Phys. Semicond., vol. 26, pp. 202-207, (1992).
(Continued)

*Primary Examiner* — Helene Klemanski
(74) *Attorney, Agent, or Firm* — Greenberg Traurig, LLP; David J. Dykeman; Roman Fayerberg

(57) ABSTRACT

Methods for synthesis of thermoelectric materials are disclosed. In some embodiments, a method of fabricating a thermoelectric material includes generating a plurality of nanoparticles from a starting material comprising one or more chalcogens and one or more transition metals; and consolidating the nanoparticles under elevated pressure and temperature, wherein the nanoparticles are heated and cooled at a controlled rate.

20 Claims, 17 Drawing Sheets

(51) Int. Cl.
  C09B 19/02   (2006.01)
  C04B 35/547  (2006.01)
  C04B 35/645  (2006.01)
  H01L 35/26   (2006.01)
  C01B 19/00   (2006.01)
  C04B 35/626  (2006.01)

(52) U.S. Cl.
  CPC .... C04B 2235/407 (2013.01); C04B 2235/656 (2013.01); C04B 2235/6562 (2013.01); C04B 2235/6565 (2013.01); C04B 2235/77 (2013.01); C04B 2235/786 (2013.01); C04B 2235/79 (2013.01); C04B 2235/9607 (2013.01)

(56) References Cited

U.S. PATENT DOCUMENTS

| | | | |
|---|---|---|---|
| 4,717,788 A | | 1/1988 | Rauch et al. |
| 5,726,381 A | * | 3/1998 | Horio et al. ............... 252/62.3 T |
| 7,255,846 B2 | * | 8/2007 | Ren et al. ................. 252/62.3 T |
| 7,586,033 B2 | * | 9/2009 | Ren et al. ....................... 136/238 |
| 7,591,913 B2 | * | 9/2009 | Ren et al. ......................... 438/54 |
| 9,099,601 B2 | | 8/2015 | Ren et al. |
| 2002/0175312 A1 | * | 11/2002 | Fleurial et al. ........... 252/62.3 T |
| 2008/0202575 A1 | | 8/2008 | Ren et al. |
| 2009/0178700 A1 | | 7/2009 | Heremans et al. |
| 2011/0240081 A1 | * | 10/2011 | Rhyee et al. ................. 136/203 |
| 2011/0248209 A1 | | 10/2011 | Androulakis et al. |
| 2012/0097906 A1 | | 4/2012 | Snyder et al. |
| 2013/0140507 A1 | * | 6/2013 | Rowe ....................... 252/519.13 |

OTHER PUBLICATIONS

Jaworski, Christopher M., et al. "Combining alloy scattering of phonons and resonant electronic levels to reach a high thermoelectric figure of merit in PbTeSe and PbTeS alloys", Energy & Environmental Science, vol. 4, pp. 4155-4162, (2011).
Sootsman, et al., "Microstructure and Thermoelectric Properties of Mechanically Robust PbTe—Si Eutectic Composites", Chemistry of Materials, vol. 22, pp. 869-875, (2010).
Khokhlov, D. Lead Chalcogenides Physics and Applications; Taylor & Francis Books; New York & London, 2003.
Pei, Y., et al., "Convergence of Electronic Bands for High Performance Bulk Thermoelectrics", Nature, vol. 473, 66-69, May 5, 2011.
Xiong, K., et al., "Behaviour of Group IIIA Impurities in PbTe: Implications to Improve Thermoelectric Efficiency", Phys. D: Appl. Phys., 43, 405403, Sep. 21, 2010.
Ahmad, S., et al., "Ab initio Studies of the Electronic Structure of Defects in PbTe", Phys. Rev. B, 74, 155205-1-155205-13, Oct. 19, 2006.
Delaire, O., et al., "Giant Anharmonic Phonon Scattering in PbTe", Nature Materials, vol. 10, pp. 614-619, Aug. 2011.
Singh, D. J., "Doping-dependent Thermopower of PbTe from Boltzmann Transport Calculations", Phys. Rev. B, vol. 81, 195217-1-195217-6, May 27, 2010.
DiSalvo, Francis J., "Thermoelectric Cooling and Power Generation", Science, vol. 285, pp. 703-706, (1999).
Kraemer, D., et al., "High-performance Flat-panel Solar Thermoelectic Generators with High Thermal Concentration", Nature Materials, vol. 10, pp. 532-538, May 1, 2011.
Harman, T. C. et al., "Quantum Dot Superlattice Thermoelectric Materials and Devices", Science, vol. 297, pp. 2229-2232, Sep. 27, 2002.
Yan, X., et al., "Enhanced Thermoelectric Figure of Merit of p-Type Half Heuslers", Nano Letters, vol. 11, pp. 556-560, Dec. 22, 2010.
Zhang, Q., et al., "High Figures of Merit and Natural Nanostructures in $Mg_2Si_{0.4}Sn_{0.6}$ based Thermoelectric Materials", Appl. Phys. Lett., vol. 93, pp. 102109-1-102109-3, Sep. 2008.
Poudel, B., et al., "High-Thermoelectic Performance of Nanostructured Bismuth Antimony Telluride Bulk Alloys", Science, vol. 320, pp. 634-638, May 2, 2008.

Sales, B. C., et al., "Filled Skutterudite Antimonides: A New Class of Thermoelectric Materials", Science, vol. 272, p. 1325, May 31, 1996.
Yu, C., et al., "Improved Thermoelectric Performance in the Zintl Phase Compounds $Yb Zn_{2-x} Mn_x Sb_2$ via Isoelectronic Substitution in the Anionic Framework", Appl. Phys., vol. 104, 013705-1, Jul. 2008.
Kleinke, H., "New bulk Materials for Thermoelectric Power Generation: Clathrates and Complex Antimonides", Chem. Mater., vol. 22, pp. 604-611, Aug. 25, 2009.
Dresselhaus, M. S., et al., "New Directions for Low-Dimensional Thermoelectric Materials", Adv. Mater., vol. 19, 1043-1053, Apr. 20, 2007.
Liu, W. S., "Recent Advances in Thermoelectric Nanocomposites", Nano Energy, vol. 1, pp. 42-56, (2012).
Martin, J., et al., "Enhanced Seebeck Coefficient through Energy-barrier Scattering in PbTe Nanocomposites", Phys. Rev. B, vol. 79, pp. 115311-1-115311-5, Mar. 13, 2009.
Faleev, S. V., et al., "Theory of Enhancement of Thermoelectric Properties of Materials with Nanoinclusions", Phys. Rev. B, vol. 77, pp. 214304-1-214304-9, Jun. 12, 2008.
Zhang, Q., et al., "Heavy Doping and Band Engineering by Potassium to Improve the Thermoelectric Figure of Merit in p-Type PbTe, PbSe, and $PbTe_{1-y}Se_y$", J. Am. Chem. Soc., vol. 134, pp. 10031-10038, May 24, 2012.
Scheele, M., et al., "Synthesis and Thermoelectric Characterization of $Bi_2Te_3$ Nanoparticles", Adv. Funct. Mater., vol. 19, pp. 3476-3483, Nov. 9, 2009.
Zhang, Q., et al., "Tuning the Shape and Thermoelectric Property of PbTe Nanocrystals by Bismuth Doping", Nanoscale, vol. 2, pp. 1256-1259, May 19, 2010.
Ahmad, S., et al., "Ab Initio Study of Deep Defect States in Narrow Band-Gap Semiconductors: Group III Impurities in PbTe", Phys. Rev. L, vol. 96, pp. 056403-1-056403-4, Feb. 8, 2006.
Yu, B., et al., "Thermoelectric Property Studies on Thallium-doped Lead Telluride prepared by Ball Milling and Hot Pressing", Appl. Phys., vol. 108, pp. 016104-1, Jul. 12, 2010.
Parker, D., et al., "High-temperature Thermoelectric Performance of Heavily Doped PbSe", Phys. Rev. B, vol. 82, pp. 035204-1-035204-5, Jul. 8, 2010.
LaLonde, A. D., et al., "Reevaluation of $PbTe_{1-x}I_x$ as High Performance n-type Thermoelectric Material", Energy Environ. Sci., vol. 4, pp. 2090-2096, Apr. 2011.
Wang, H., et al., "Heavily Doped p-Type PbSe with High Thermoelectric Performance: An Alternative for PbTe", Adv. Mater., vol. 23, pp. 1366-1370, Feb. 10, 2011.
Zhang, Q. Y., et al., "Enhancement of Thermoelectric Figure-of-merit by Resonant States of Aluminium Doping in Lead Selenide", Energy Environ. Sci., vol. 5, pp. 5246-5251, Oct. 2011.
Androulakis, J., et al., "High-temperature Thermoelectric Properties of n-type PbSe Doped with Ga, In, and Pb", Phys. Rev. B, vol. 83, pp. 195209-1-195209-9, May 31, 2011.
Androulakis, J., et al., "Thermoelectric Enhancement in PbTe with K or Na Codoping from Tuning the Interaction of the Light- and Heavy-hole Valence Bands", Phys. Rev. B, vol. 82, pp. 115209-1-115209-8, Sep. 16, 2010.
Vineis, et al., "Nanostructured Thermoelectrics: Big Efficiency Gains from Small Features", Advanced Materials, vol. 22, pp. 3970-3980, (2010).
Nolas, et al., "Semiconducting Ge clathrates: Promising candidates for thermoelectric applications", Applied Physics Letters, vol. 73, No. 2, pp. 178-180, (1998).
Snyder, et al., "Complex thermoelectric materials", Nature Materials, vol. 7, pp. 105-114, (2007).
Venkatasubramainian, et al., "Thin-film thermoelectric devices with high room-temperature figures of merit", Nature, vol. 413, pp. 597-602, (2001).
Fujita, et al., "High-Temperature Thermoelectric Properties of $Na_x CoO_{2-\delta}$ Single Crystals", Jpn. J. Appl. Phys., vol. 40, pp. 4644-4647, (2001).
Koumoto, et al., "Complex Oxide Materials for Potential Thermoelectric Applications", MRS Bulletin, vol. 31 pp. 206-210, (2006).

(56) References Cited

OTHER PUBLICATIONS

Chen, G., "Size and Interface Effects on Thermal Conductivity of Superlattices and Periodic Thin-Film Structures", http://heattransfer.asmedigitalcollection.asme.org/, vol. 19, (1997).

Chen, G., "Thermal conductivity and ballistic-phonon transport in the cross-plane direction of superlattices", Physical Review B, vol. 57, No. 23, pp. 14958-14973, (1998).

Rhyee, Jong-Soo, et al., "Peierls distortion as a route to high thermoelectric performance in In4Se3-δ crystals", Nature, vol. 459, pp. 965-968, (2009).

Yamamoto, K., et al., "X-Ray Study of the Average Structures of Cu2Se and Cu 1.8S in the Room Temperature and the High Temperature Phases", Journal of Solid State Chemistry, vol. 93, pp. 202-211, (1991).

Yakshibayev, R.A., et al., "Ionic Conductivity and Chemical Diffusion in Ag2Se—Cu2Se Mixed Conductor Compounds", Solid State Ionics, vol. 31, pp. 247-251, (1989).

Karamov, F.A., "Superionic Conductors: Heterostructures and elements of functional electronics based on them", Cambridge International Science Publishing, Cambridge, UK, p. 16, (2008).

Tari, A., "The Specific Heat of Matter at Low Temperatures", Imperial College Press, London, UK, p. 153, (2003).

Gronvold, F., "Silver(I) sulfide: Ag2S Heat capacity from 5 to 1000 K, thermodynamic properties, and transitions", J. Chem. Thermodynamics, vol. 18, pp. 381-401, (1986).

Gascoin, et al., "Order—Disorder Transition in AgCrSe2: a New Route Efficient Thermoelectrics", Chemistry of Materials, vol. 23, pp. 2510-2513, (2011).

Trachenko, K., "Heat Capacity of Liquids: An approach from the solid phase", Physical Review B, vol. 78, pp. 104201-1 to 104201-7, (2008).

Hull, S., "Superionics: crystal structures and conduction processes", Rep. Prog. Phys., vol. 67, pp. 1233-1314, (2004).

Shi, et al., "Mutliple-Filled Skutterudites: High Thermoelectric Figure of Merit through Separately Optimizing Electrical and Thermal Transports", Journal of the Americal Chemical Society, vol. 133, pp. 7837-7846, (2011).

Hsu, et al., "Cubic AgPbmSbTe2+m: Bulk Thermoelectric Materials with high Figure of Merit", Science Magazine, vol. 303, pp. 818-821, (2004).

Slack, G.A., CRC Handbook of Thermoelectrics, CRC Press, Boca Raton, 1995.

Heremans et al., "Enhancement of Thermoelectric Efficiency in PbTe by Distortion of the Electronic Density of States", Science, vol. 321, pp. 554-557, (2008).

Pei, et al., "High thermoelectric figure of merit in heavy hle dominated PbTe", Energy and Environmental Science, vol. 4, pp. 2085-2089, pub. online Jan. 2011.

\* cited by examiner

METHODS OF SYNTHESIZING THERMOELECTRIC MATERIALS

RELATED APPLICATIONS

This application claims the benefit of and priority to U.S. Provisional Application Ser. No. 61/608,999, filed Mar. 9, 2012, the entirety of which is hereby incorporated herein by reference for the teachings therein.

STATEMENT OF GOVERNMENT SUPPORT

This invention was made with Government Support under Contract Number DE-SC0001299 awarded by the U.S. Department of Energy. The U.S. Government has certain rights to the invention.

FIELD

The embodiments disclosed herein relate to thermoelectric materials, and more particularly to metal selenides having a layered structures.

BACKGROUND

Solid-state thermoelectric converters are recently receiving increasing attention due to their potential to make important contributions to the effort on reducing $CO_2$ and greenhouse gas emission and providing cleaner forms of energy. Such converters utilize thermoelectric materials, that is, materials that show the thermoelectric effect in a strong and/or convenient form. Thermoelectric effects involve direct conversion between thermal and electrical energy by employing electrons and holes as the energy carriers, which can be used, for example, for waste heat recovery, and for thermal management of microelectronics and biological systems. A good thermoelectric material has high dimensionless figure-of-merit ZT: defined as $(S^2\sigma/\kappa)T$, where the S, $\sigma$, $\kappa$, and T are the Seebeck coefficient, electrical conductivity, thermal conductivity, and absolute temperature, respectively. Numerous efforts have been devoted in the last two decades in order to increase the ZT value from the longstanding 1.0 in thermoelectric bulk materials to higher values.

SUMMARY

Methods of synthesizing thermoelectric materials are disclosed. In some aspects, there is provided a method of fabricating a thermoelectric material that includes generating a plurality of nanoparticles from a starting material comprising one or more chalcogens and one or more transition metals; and consolidating the nanoparticles under elevated pressure and temperature, wherein the nanoparticles are heated and cooled at a controlled rate.

In some aspects, there is provided a method of producing a thermoelectric material that includes generating a plurality of nanoparticles from a starting material comprising selenium and copper; and consolidating the nanoparticles under elevated pressure and temperature, wherein the nanoparticles are heated and cooled at a controlled rate.

In some aspects, there is provided a method of synthesizing a thermoelectric material that includes generating a plurality of nanoparticles from a starting material consisting essentially of selenium and copper; heating the plurality of nanoparticles at a controlled rate; consolidating the plurality of nanoparticles under elevated pressure and temperature; and cooling the consolidated plurality of nanoparticles at a controlled rate.

BRIEF DESCRIPTION OF THE DRAWINGS

The presently disclosed embodiments will be further explained with reference to the attached drawings, wherein like structures are referred to by like numerals throughout the several views. The drawings shown are not necessarily to scale, with emphasis instead generally being placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

Novel thermoelectric materials and methods for producing such materials are disclosed herein. According to aspects illustrated herein, there are provided metal selenides that have a layered structures with an ordered Se layer and a disordered metal layer, wherein the metal selenides have a figure of merit greater than 1. In some embodiments, metal selenides are β phase copper selenides with an ordered selenide layer and disordered copper layer that have a figure of merit (ZT) of about 1.6 at 700° C.

According to aspects illustrated herein, there is provided a method for producing thermoelectric materials that includes subjecting a metal, such as copper (Cu), and selenium (Se) to high-energy ball milling followed by consolidating the metal and Se into bulk samples via a hot pressing method. In some embodiments, the hot pressing is performed at between about 400° C. and about 700° C.

A good thermoelectric material has high dimensionless figure-of-merit ZT: defined as $(S^2 \sigma/\kappa)T$, where the S, σ, κ, and T are the Seebeck coefficient, electrical conductivity, thermal conductivity, and absolute temperature, respectively. Normally, κ is composed of three components, i.e., electronic contribution ($\kappa_{car}$), lattice contribution ($\kappa_{lat}$), and bipolar contribution ($\kappa_{bipolar}$).

Figures 1A, 1B:
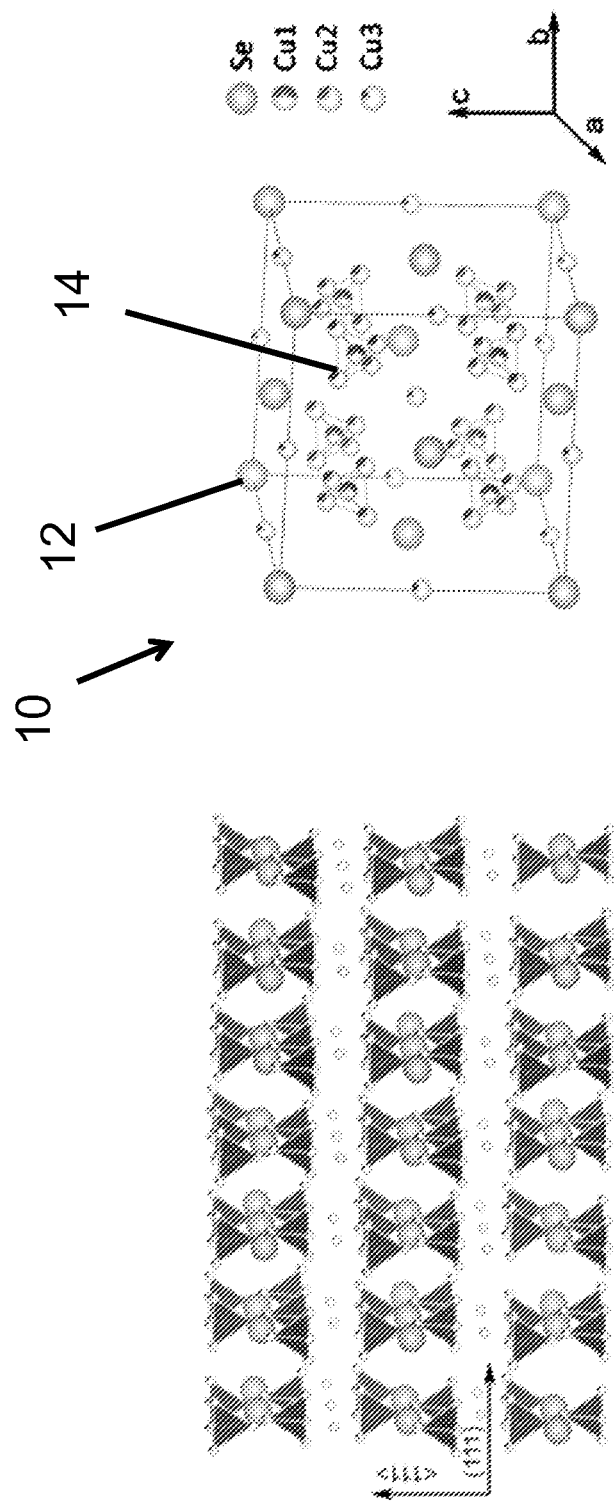
FIG. 1A is schematic depiction of the crystal structure of cubic β-phase $Cu_2Se$ along (111) plane.
FIG. 1B is schematic depiction of a FCC unit cell of β-phase $Cu_2Se$ with proposed possible Cu distribution at (0.25, 0.25, 0.25), (0.315, 0.315, 0.315), and (0.5, 0.5, 0.5) along <111> direction.

The thermoelectric materials of the present disclosure are metal selenides characterized by a figure of merit greater than 1. In some embodiments, the metal selenides of the present disclosure have a layered structures with an ordered Se layer and a disordered metal layer. In some embodiments, metal selenides of the present disclosure have a layered structure, a lattice with mobile ions or both. In some embodiments, such metal selenides are formed by combining selenium (Se) and copper (Cu). In some embodiments, such copper selenides are phase copper selenides having an ordered Se layer and disordered Cu layer. In some embodiments, copper selenides of the present disclosure have a general stoichiometric formula of $Cu_2Se_{1+x}$. Changes in the Cu/Se ratio in the final product can be achieved by changing the amount of Se in the initial composition. By way of a non-limiting example, copper selenide of the present disclosure is $Cu_2Se$. In some embodiments, copper selenide of the present disclosure is $Cu_2Se_{1.02}$. In some embodiments, copper selenide of the present disclosure is $Cu_2Se_{1.01}$. As shown in FIG. 1A and FIG. 1B, β phase copper selenides 10 of the present disclosure crystallized in a layered cubic FCC structure, having an ordered Se layer 12 and disordered Cu layer 14.

Although the thermoelectric materials of the present disclosure are being described in reference to copper selenides, the present disclosure is not limited to this specific material. In some embodiments, other transition metals can be used to form metal selenides of the present disclosure, such as titanium (Ti), iron (Fe), nickel (Ni), and manganese (Mn), as long as such metal selenides have a layered structure, a lattice with mobile ions or both to result in the increased figure of merit. In some embodiments, according to embodiments of the present disclosure, other chalcogens may be employed instead of and in addition to selenium. In some embodiments, the present disclosure further provides metal sulfides or metal tellurides with a layered structures of an ordered sulfur (S) or tellurium (Te) layer and a disordered metal layer. In some embodiments, the above-listed elements can be combined to form thermoelectric materials of the present disclosure, as long as the resulting materials have a layered structure, a lattice with mobile ions or both to result in the increased figure of merit. In some embodiments, the thermoelectric material of the present disclosure formed by combination of the above-listed elements is $Cu_2Se_{0.5}Te_{0.5}$.

In some embodiments, the present disclosure provides a metal selenide material having a figure of merit (ZT) of about 1.6 at about 700° C. In some embodiments, the present disclosure provides β-phase copper selenide having a figure of merit (ZT) of about 1.6 at about 700° C. In some embodiments, thermoelectric materials of the present disclosure have low lattice thermal conductivity of 0.4-0.5 $Wm^{-1} K^{-1}$ from room temperature to 700° C. In some embodiments, the β-phase of such material possesses a structure combination of ordered selenium (Se) and disordered copper (Cu) layers, resulting in a low lattice thermal conductivity of 0.4-0.5 $Wm^{-1}K^{-1}$. In some embodiments, the low lattice thermal conductivity in the thermoelectric materials of the present disclosure is due to a unique combination of monoatomically ordered Se layer and disordered metal layer, such as Cu layer, in their crystal structure. In some embodiments, the increased random motion of metal atoms results in a slightly decreasing Cp values at above 200° C. In some embodiments, in the themorelectric materials of the present disclosure, a solid-state transition from a tetragonal α-phase to the FCC β-phase takes place at around 140° C., as indicated in the plots of their thermoelectric transport properties, and can also be confirmed by XRD and HRTEM studies at different temperatures.

Figure of merit of 1.6 at 700° C. is among the highest values of reported thermoelectric materials in bulk form that could be practically used (thin-film thermoelectrics may have better property but has almost no potential in real applications). The copper selenides have a layered structure combining ordered and disordered lamellas in its unit cell which is very similar to natural and artificial superlattices. Comparing to those structures, however, copper selenides of the present disclosure have higher figure of merit values. Moreover, natural and artificial superlattices typically have complicated crystal, while copper selenides of the present disclosure are made of only 2 types of elements involved, both of which are abundant in earth and environmentally friendly.

Figure 1C:
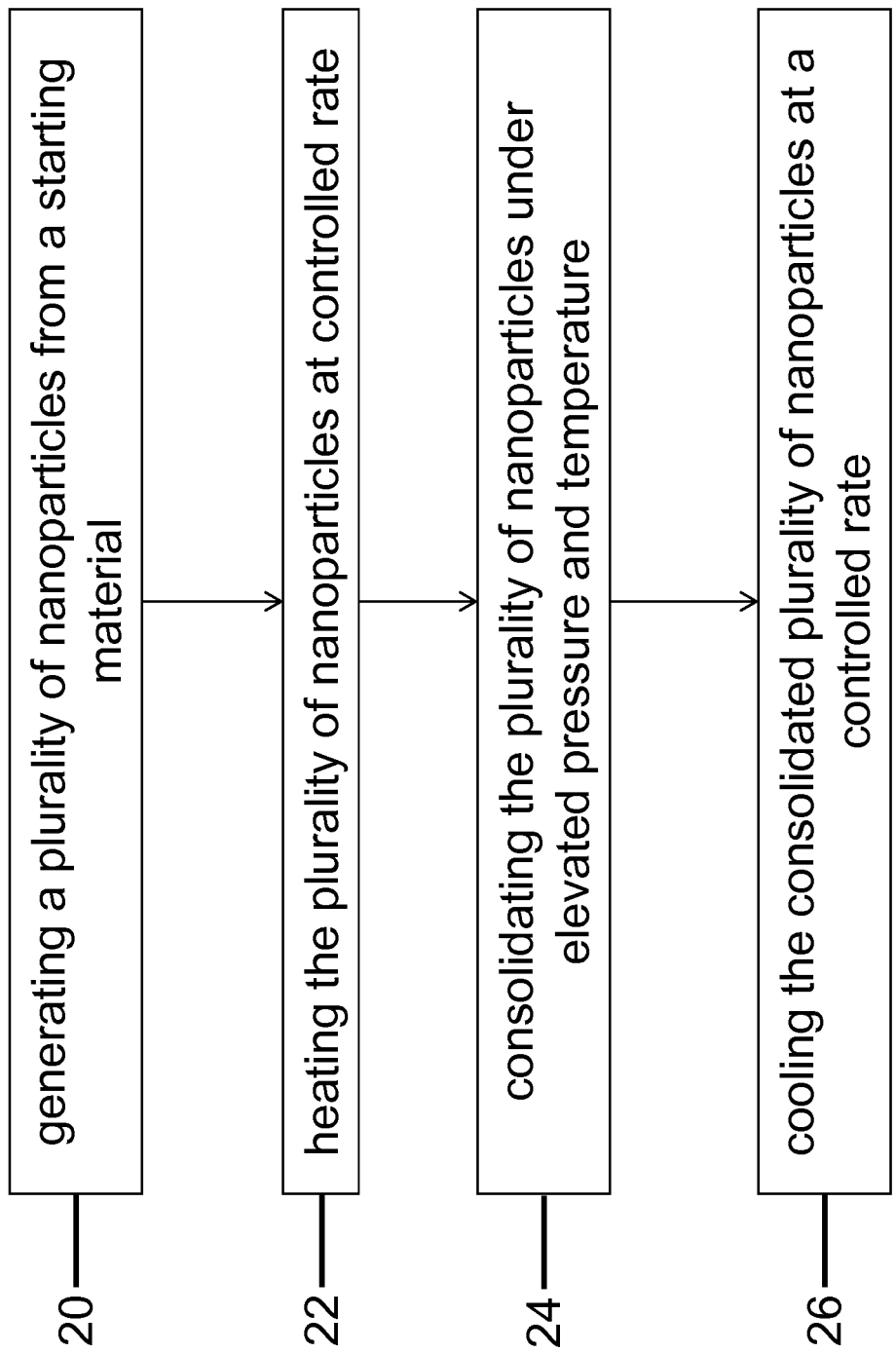
FIG. 1C illustrates steps of an embodiment method for synthesizing thermoelectric materials.

In reference to FIG. 1C, an embodiment of a method of synthesizing thermoelectric materials is illustrated. In some embodiments, the method may include a step 20 of generating a plurality of nanoparticles and a step 24 of consolidating the plurality of nanoparticles under elevated pressure and temperature. In some embodiments, the materials may be heated at a controlled rate as represented by step 22 and cooled at a controlled rate as represented by step 26.

One of the challenges in producing copper selenides of the present disclosure was to produce final materials without crack and nonuniformity. During the cooling step after consolidation, the samples can crack due to solid state phase transition. Also, high heating rate during the consolidation may cause the mobile copper ions to migrate from one end of the sample to the other end of the sample, causing nonuniformity in the properties of the sample.

Accordingly, in some embodiments, the material are heated and cooled at a controlled rate. By way of a non-limiting example, the samples may be heated at a rate of about 20°/min or lower. In some embodiments, the samples may be cooled by air at a rate of about 10°/min to about 20°/min.

In some embodiments, thermoelectric materials of the present disclosure can be used in medium temperature applications (>350° C. or even higher temperature). By way of a non-limiting example, thermoelectric materials of the present disclosure can be used in applications, including, but not limited to, waste heat recovery and conversion to electricity, power generation, and geothermal energy.

In some embodiments, the metal selenides of the present disclosure are prepared by high-energy ball milling followed by consolidation into bulk materials via a hot pressing method. In some embodiments, thermoelectric figure of merit (ZT) of ~1.6 at 700° C. is achieved in β-phase copper selenide ($Cu_2Se$) made by ball milling and hot pressing. In some embodiments, a method for producing the thermoelectric materials of the present disclosure includes subjecting a metal, such as Copper (Cu), and Selenium (Se) to high-energy ball milling followed by consolidating the metal and Se into bulk samples via a hot pressing method. In some embodiments, the hot pressing is performed at between about 400° C. and about 700° C.

To prepare copper selenides of the present disclosure, first, starting materials are combined and ground to prepare nanoparticles of the starting materials. In some embodiments, nanopowders of selenium and copper are prepared by grinding. To avoid any undesirable effect on the properties of the final materials due to impurities, the starting materials may be at least 95% pure, or in some embodiments at least 99% pure. In some embodiments, the selenium may be about 99.5% pure and copper may be about 99.9% pure. The initial amounts of copper and selenium used depends on a desired ratio of copper and selenium in the final material. Grinding can be performed using a mill, such as a ball mill using planetary motion, a figure-eight-like motion, or any other motion. When generating particles, some grinding techniques may produce substantial heat, which may affect the particle sizes and properties (e.g., resulting in particle agglomeration). Thus, in some embodiments, cooling of the starting material can be performed while grinding the starting material. Such cooling may make a thermoelectric material more brittle, and ease the creation of particles. Embodiments of the present disclosure can also utilize other methods for forming particles from the starting material.

By way of non-limiting example, the copper and selenium starting materials may be loaded into a stainless steel jar with stainless steel balls, and then subjected to a high energy ball milling (>1000 rpm). In some embodiments, the starting materials may be in the form of granules, pellets, chunks, shots, or coarse powders. In some embodiments, copper may be in the form of chunks, shots, or coarse powders and the selenium may be in the form of granules, pellets, or coarse powders. In some embodiments, the copper and selenium starting materials is subjected to ball milling for between about 10 hours to about 30 hours while each run could produce powders of >30 g. In some embodiments, the copper and selenium starting materials may be milled until nanopowders having a size from about 10 nm to about 100 nm are formed.

Next, the bulk copper selenides are prepared by consolidating copper and selenium nanopowders as-prepared by grinding. Consolidation of the particles may be performed under elevated pressure and temperature in a variety of manners, under a variety of conditions. In some embodiments, direct current induced hot press can be used, where the particles can be loaded into a graphite die with an inner diameter, of, for example, about 2 to about 12 mm and pressed using a dc hot press. The pressures utilized are typically super-atmospheric, which allow for the use of lower temperatures to achieve consolidation of the nanoparticles. In general, the pressure ranges from about 20 MPa to about 80 MPa. With respect to the elevated temperature, a range of temperatures can be utilized. In general, the temperature typically ranges from about 200° C. to about the melting point of the copper and selenium nanopowders. In some embodiments, the copper and selenium nanopowders are hot pressed at between about 400° C. and about 700° C. As noted above, during this step, the samples are heated and cooled at a controlled rate. By way of a non-limiting example, the samples may be heated at a rate of about 20°/min or lower. In some embodiments, the samples may be cooled by air at a rate of about 10°/min to about 20°/min.

In some embodiments, the bulk copper selenides may be subjected to thermal annealing to further improve stability and uniformity of the as-pressed samples. In some embodiments, the as-pressed copper selenides are annealed at a temperature lower than the temperature of consolidation. Moreover, the as-pressed samples can also be cut or polished into certain application-specific geometries.

The methods and materials of the present disclosure are described in the following Examples, which are set forth to aid in the understanding of the disclosure, and should not be construed to limit in any way the scope of the disclosure as defined in the claims which follow thereafter. The following examples are put forth so as to provide those of ordinary skill in the art with a complete disclosure and description of how to make and use the embodiments of the present disclosure, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for.

EXAMPLE 1

Sample Fabrication and Characterization $Cu_2Se$ nanopowders were first prepared from Cu (99.5%, Alfa Aesar, USA) and Se (99.99%, 5N PLUS, Canada) elements through high-energy ball milling (Spex 8000M Mixer/Mill). Bulk samples were fabricated by consolidating the as-prepared nanopowders in a graphite die (½ or 1 inch in diameter) via a conventional hot pressing method.

PANalytical multipurpose diffractometer with an X'celerator detector (PANalytical X'Pert Pro) was used for lattice structure characterizations at both room temperature and high temperature. The grain size of bulk samples was studied on a scanning electron microscope (SEM, JEOL-6340F). The structural change versus temperature was monitored by in situ heating experiments inside a high-resolution transmission electron microscope (HRTEM, JEOL-2010F). The bulk sample was first hand polished and then fixed on a Mo grid with epoxy (stable up to 1000° C.). Subsequently, the polished sample was ion milled with a Precision Ion Polishing System (model 691, Gatan) till electron transparent and loaded on the heating holder (model 652, Gatan) for in situ observation.

A commercial four-probe system (ULVAC ZEM-3) was used for transport property measurement to simultaneously measure electrical resistivity and Seebeck coefficient. A laser flash system (NETZSCH LFA 457) was used for the thermal diffusivity characterization. Specific heat ($C_r$) data was obtained on a differential scanning calorimetry (NETZSCH DSC 404C) station.

EXAMPLE 2

Results and Discussions

Figure 1D:
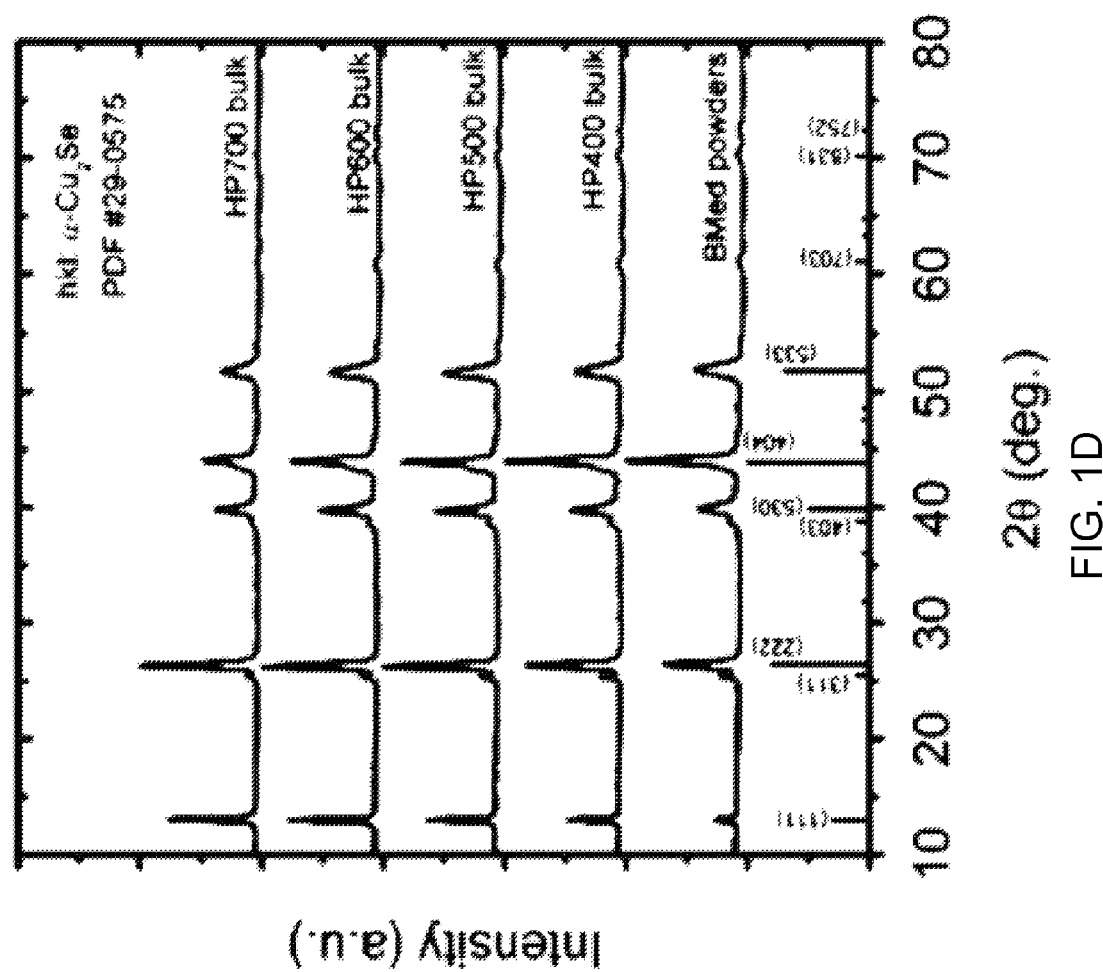
FIG. 1D presents room temperature XRD patterns of $Cu_2Se$ nanopowders and bulk samples hot pressed at 400° C. (HP400 bulk), 500° C. (HP500 bulk), 600° C. (HP600 bulk), and 700° C. (HP700 bulk).
Figure 1E:
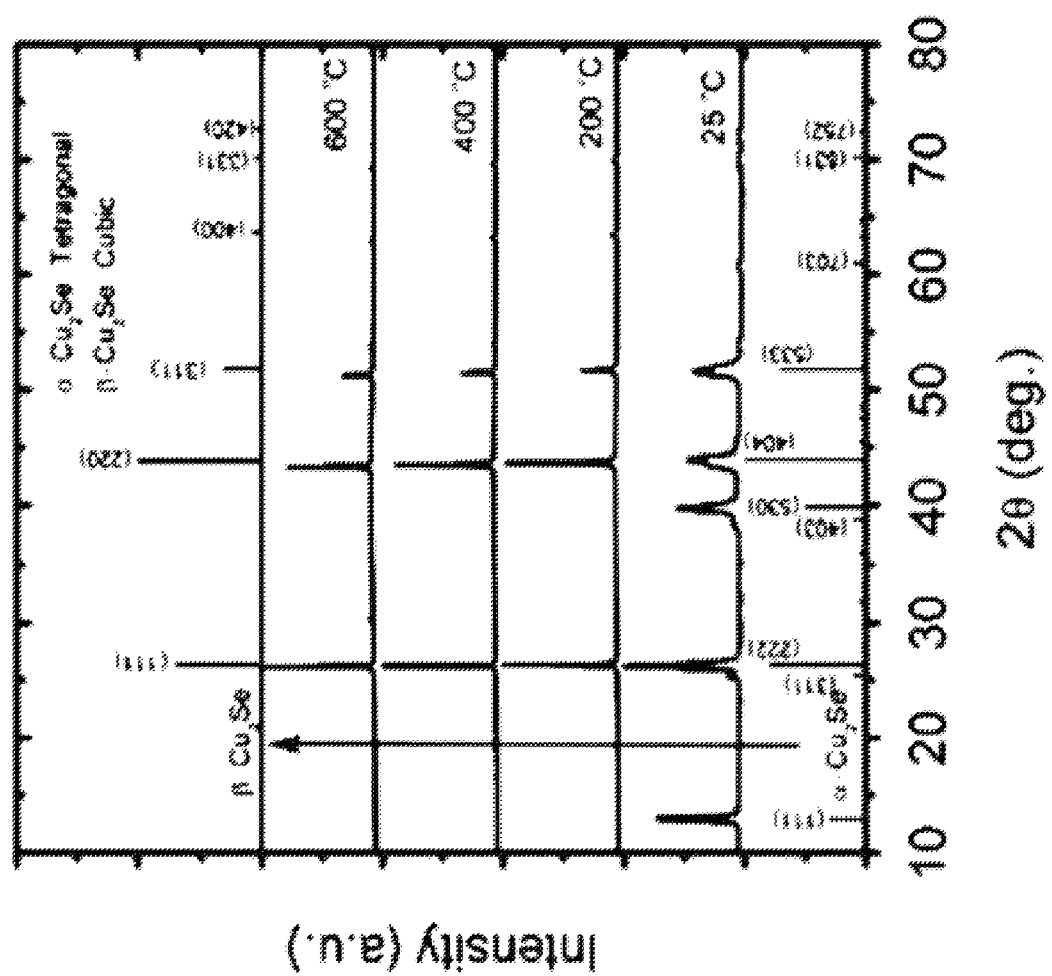
FIG. 1E presents temperature dependent XRD patterns of hot pressed (700° C.) $Cu_2Se$ bulk samples measured at 25, 200, 400, and 600° C.

Conventionally, β-phase $Cu_2Se$ has been known as a superionic conductor which crystallizes in an $Fm\overline{3}m$ type of lattice with Se atoms occupying the (0, 0, 0) site while the knowledge of Cu sites still remains controversial due to its variation with temperatures. FIG. 1B shows a possible three-site model for the location of Cu atoms in β-phase $Cu_2Se$ at 160° C. where Cu fractionally locates at (0.25, 0.25, 0.25), (0.315, 0.315, 0.315), and (0.5, 0.5, 0.5) sites as was mostly reported. In those models all the Cu sites fall in the <111> direction. Along the (111) plane direction, a lamella structure is clearly seen, in which the monoatomic Se layer is separated by two randomly distributed Cu layers. During cooling process, β-phase turns into α-phase at temperatures lower than 140° C. and this phase transition was reported to be reversible. Compared to β-phase, which has an FCC structure, the structure of α-phase $Cu_2Se$ is much more complicated since it could crystallize in three possible ways: monoclinic, tetragonal, and cubic. FIG. 1D shows that the α-phase $Cu_2Se$ nanopowders that were obtained from high-energy ball milling are tetragonal phase (PDF#29-0575) at room temperature. After being consolidated into bulk form via hot pressing, those α-phase $Cu_2Se$ polycrystals show an increase of {111} texturing (see the intensity of planes (111) and (222) relatively to that of (404) in FIG. 1D) with the pressing temperature from 400 to 700° C. Similar XRD patterns were obtained when measured along both vertical and parallel directions (to the hot pressing force direction) on those bulk samples. As shown in FIG. 1E, high temperature XRD measurements were also done at 200, 400, and 600° C. for the samples pressed at 700° C. where the phase transformation between 25 and 200° C. could be seen and the high-temperature β-$Cu_2Se$ phase shows the texturing in {111} planes as well. The cubic β-phase has smaller unit cell (e.g., 200° C., a=b=c=5.8639 Å) than the low-temperature tetragonal α-phase (a=b=11.52 Å and c=11.74 Å at room temperature), which makes the (111) plane of β-phase correspond directly to the (222) plane of α-phase. Furthermore, through the XRD study it was found that the lattice parameter of the cubic β-phase $Cu_2Se$ changed from 5.8639 to 5.8918 to 5.9172 Å when the measurement temperature increased from 200 to 400 to 600° C., respectively, indicating a possible change in Cu sites with a large thermal expansion of $22\times10^{-6}$ $K^{-1}$.

Figures 2A, 2B, 2C:
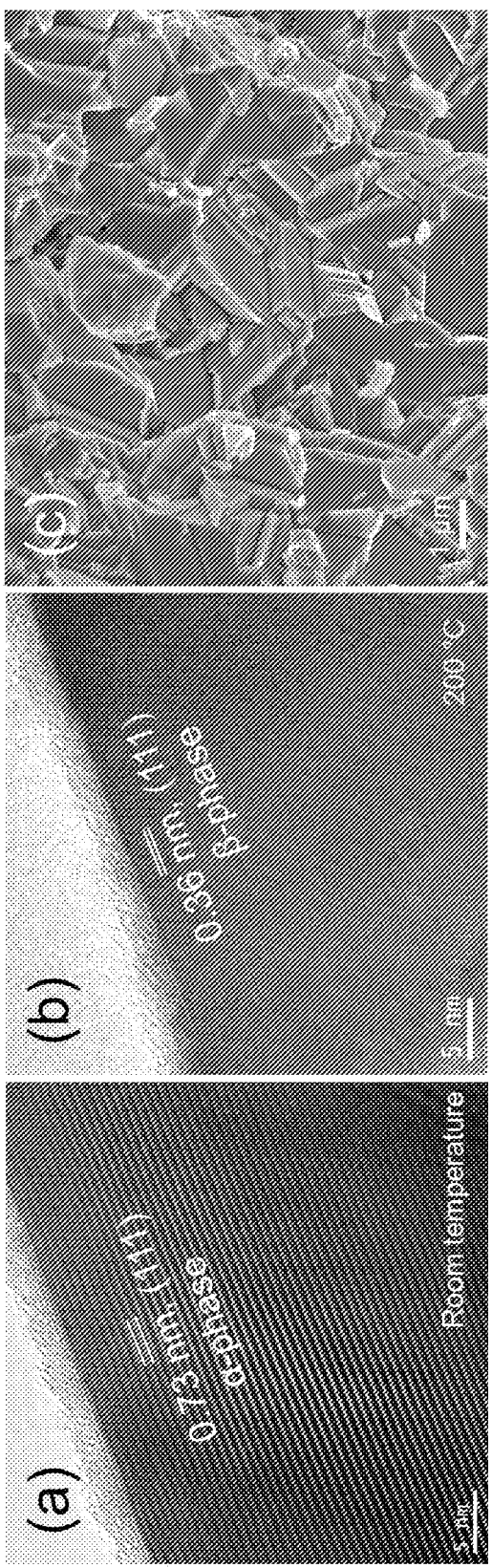
FIG. 2A presents HRTEM microstructure image of as-prepared (pressed at 700° C.) $Cu_2Se_{1.01}$ sample at room temperature.
FIG. 2B presents HRTEM microstructure image of as-prepared (pressed at 700° C.) $Cu_2Se_{1.01}$ sample at 200° C.
FIG. 2C presents an SEM image taken from the sample in FIG. 2A and FIG. 2B to show the grain size.

FIG. 2A is a room temperature HRTEM image of a typical as-prepared bulk sample, where the ordered tetragonal (111) lattice planes are clearly seen. As the sample temperature reached 200° C., the (111) lattice planes in β-phase were also observed, as shown in FIG. 2B; however, these planes now belong to the FCC crystals instead and correspond to the (222) planes in tetragonal α-phase lattice as we discussed above. This observation suggests the phase change and possible disordering of Cu sites at elevated temperature, which agrees well with the XRD results above. FIG. 2C shows that the grains are typically within a few micrometers.

Figure 3A:
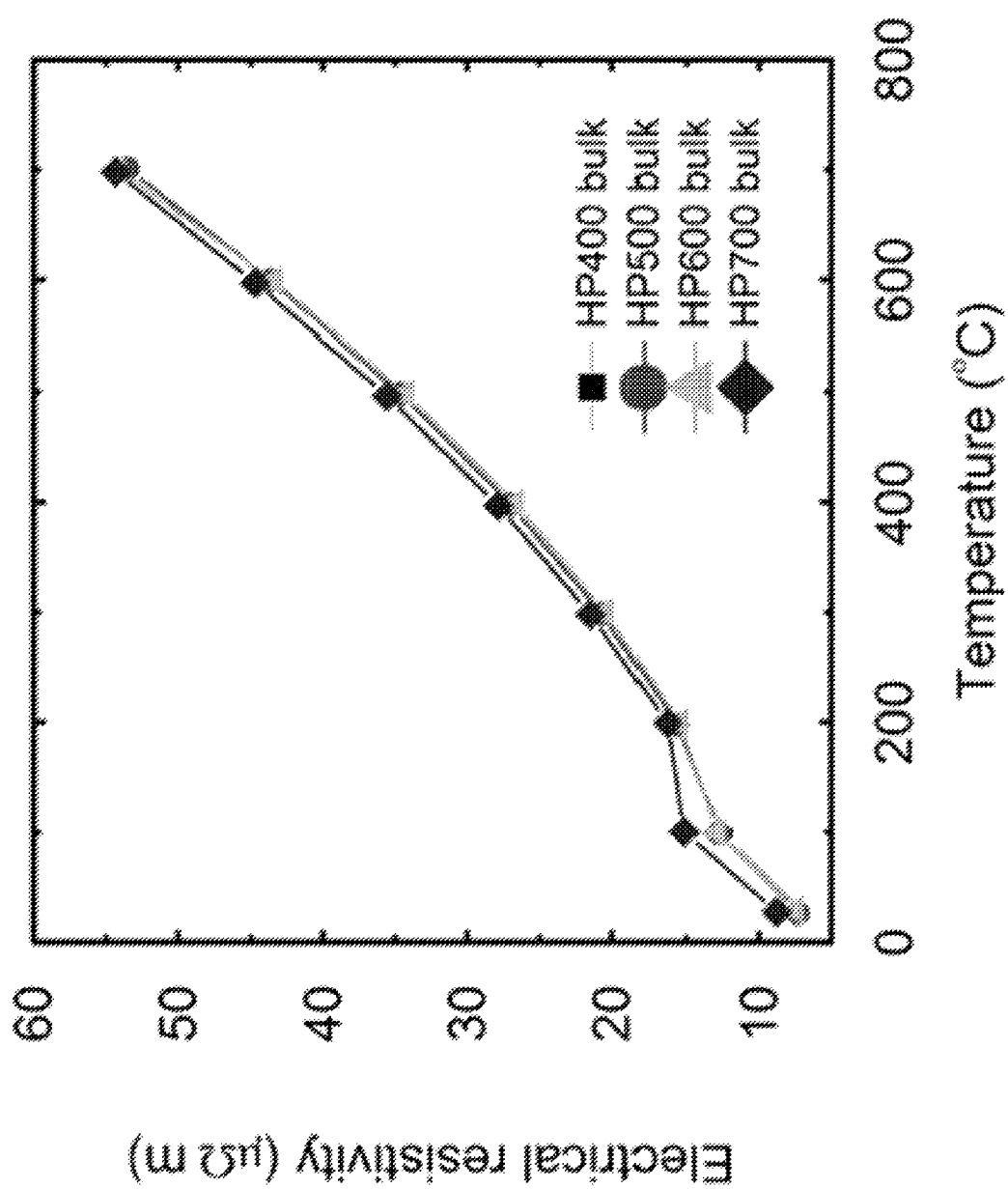
FIG. 3A is a graph showing temperature dependence of electrical resistivity of $Cu_2Se_{1.01}$ bulk samples prepared with different hot pressing temperatures.
Figure 3B:
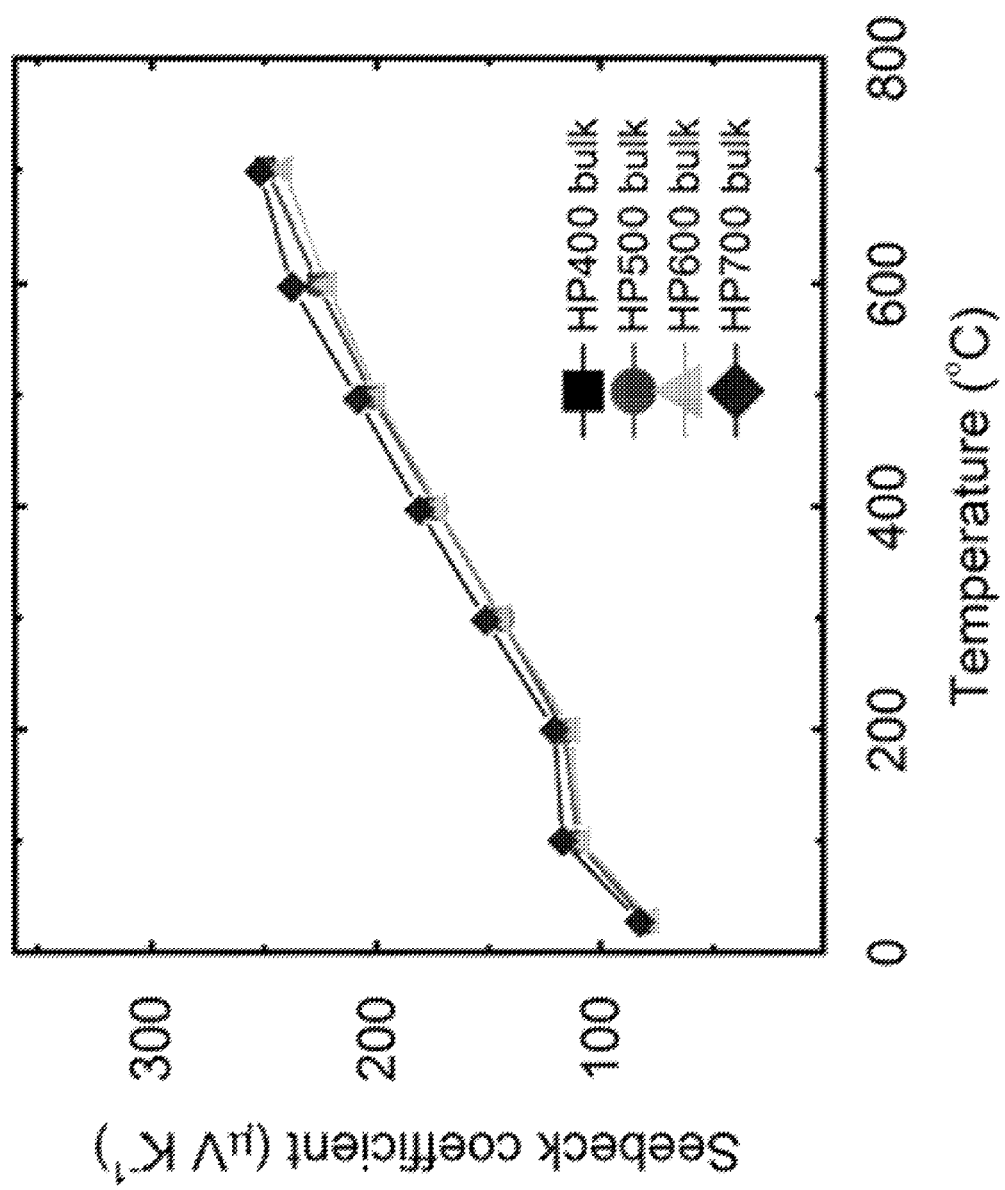
FIG. 3B is a graph showing temperature dependence of Seebeck coefficient of $Cu_2Se_{1.01}$ bulk samples prepared with different hot pressing temperatures.
Figure 3C:
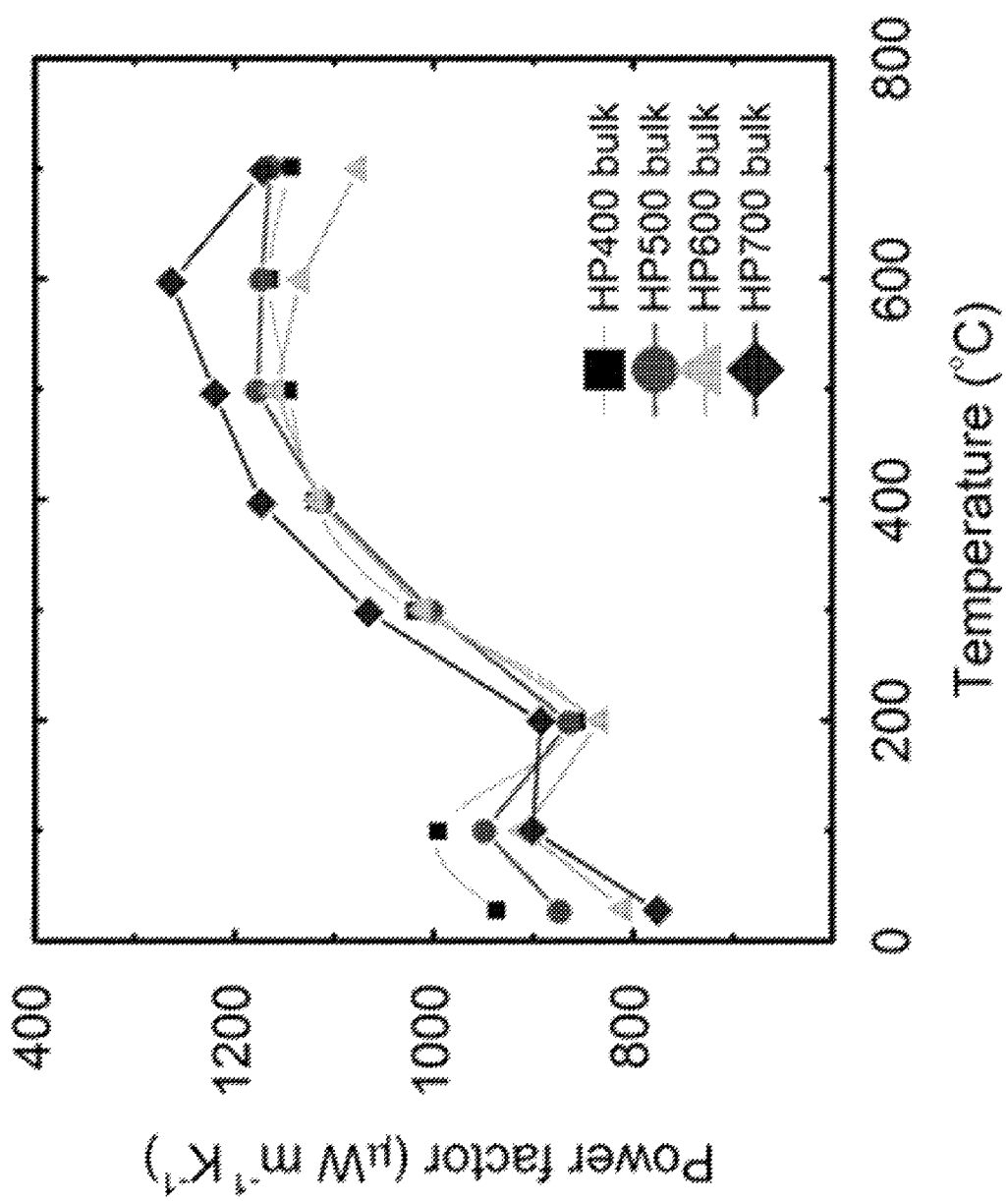
FIG. 3C is a graph showing temperature dependence of power factor coefficient of $Cu_2Se_{1.01}$ bulk samples prepared with different hot pressing temperatures.

FIGS. 3A-3F show the temperature dependent thermoelectric properties of $Cu_2Se_{1.01}$ samples that were hot pressed at different temperatures. The extra Se was used to compensate the potential Se loss during hot pressing due to its high vapor pressure. As shown in FIG. 3A, electrical resistivity of a typical $Cu_2Se_{1.01}$ sample is about 6-8 μΩm at room temperature and increases quickly to about 55 μΩm at 700° C. As shown in FIG. 3B and FIG. 3C, with Seebeck coefficient increasing from 75 to 250 $\mu V^{-1}$, these samples have moderate power factor of 750~950 $\mu Wm^{-1}K^{-1}$ at room temperature and peaked around 1125~1250 $\mu Wm^{-1}K^{-1}$ at 600° C.

Figure 3D:
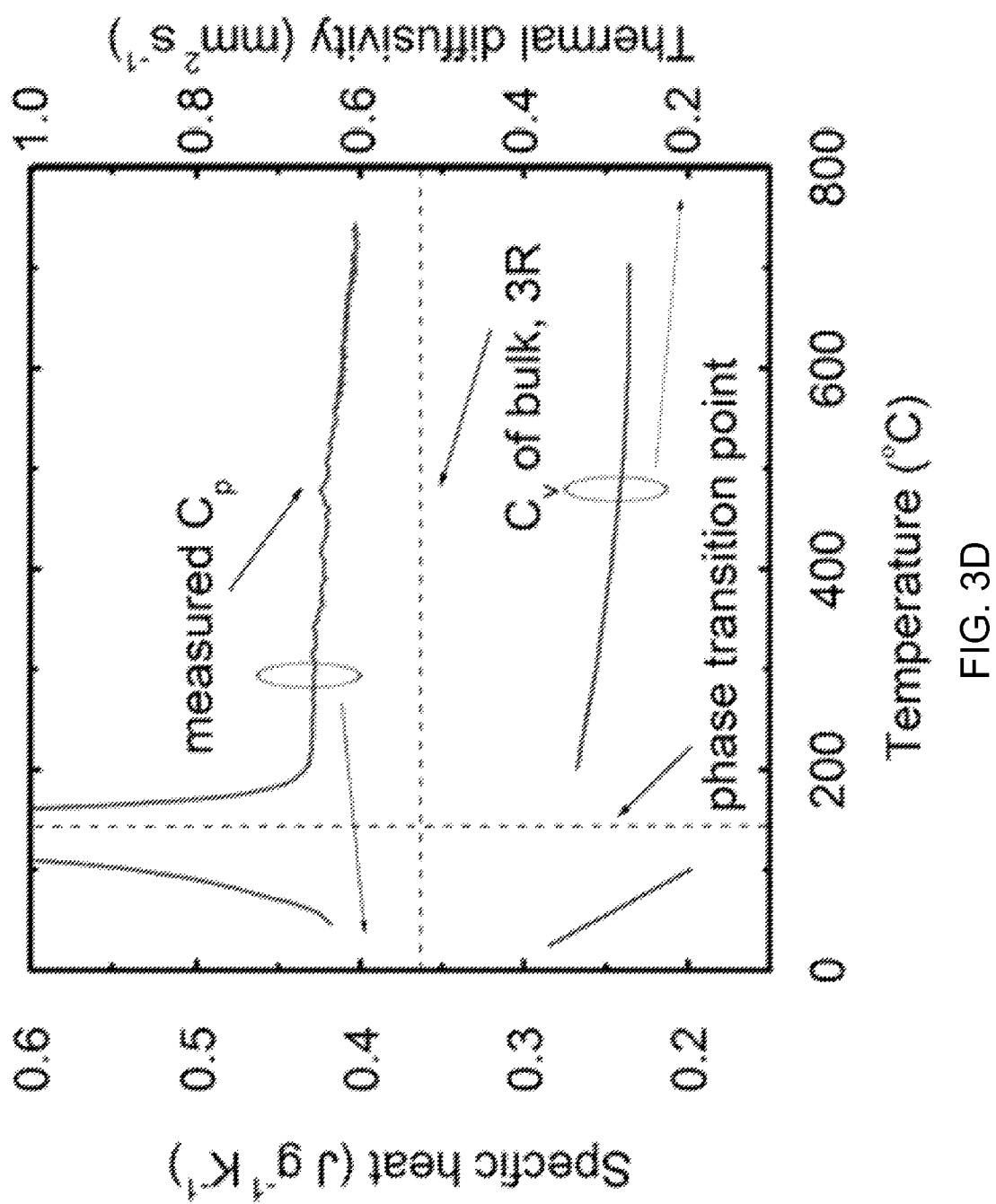
FIG. 3D is a graph showing temperature dependence of specific heat (Cp), and thermal diffusivity (HP700 bulk) of $Cu_2Se_{1.01}$ bulk samples prepared with different hot pressing temperatures.
Figure 3E:
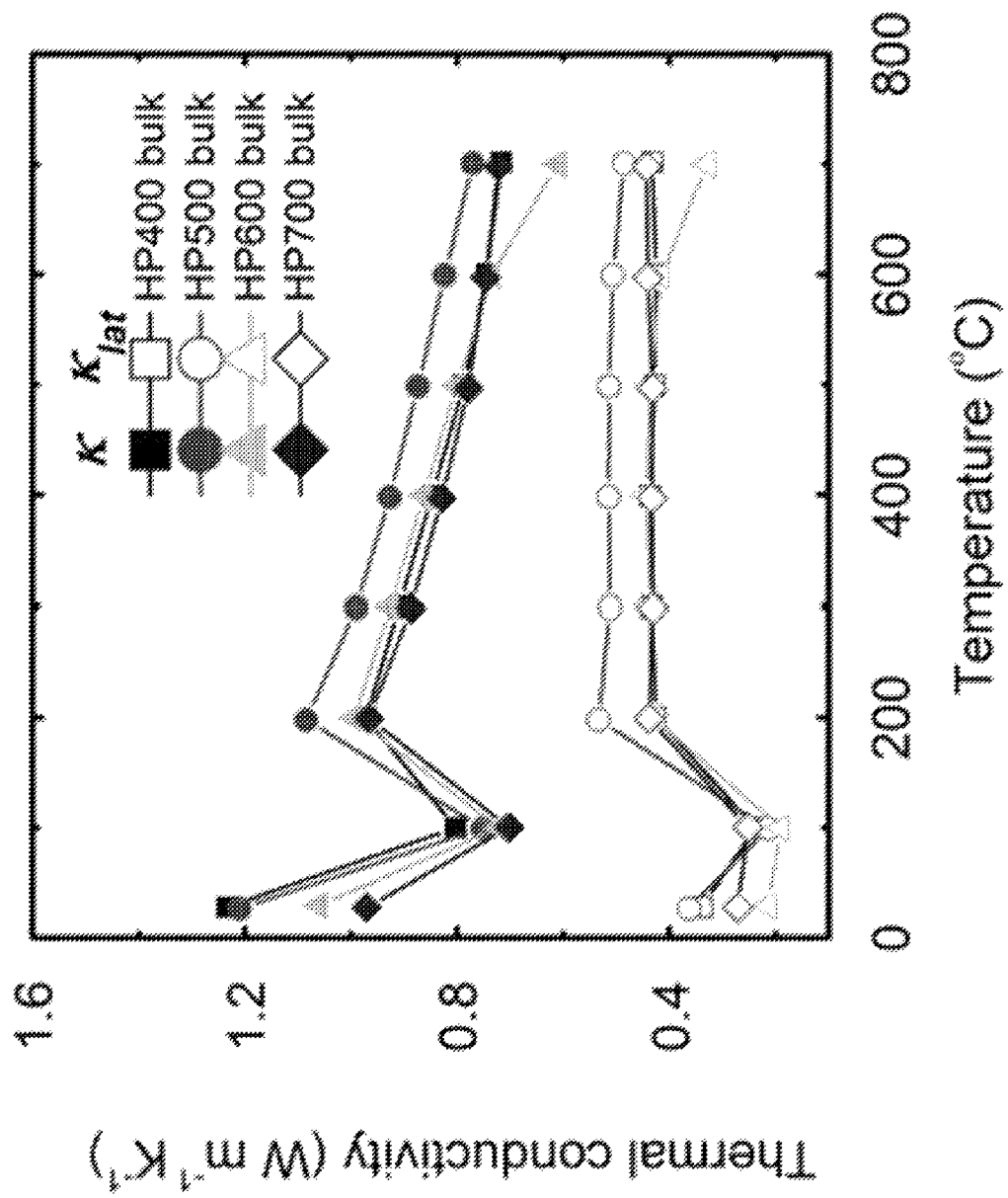
FIG. 3E is a graph showing temperature dependence of total thermal conductivity (filled symbols) and lattice thermal conductivity (open symbols) of $Cu_2Se_{1.01}$ bulk samples prepared with different hot pressing temperatures.
Figure 3F:
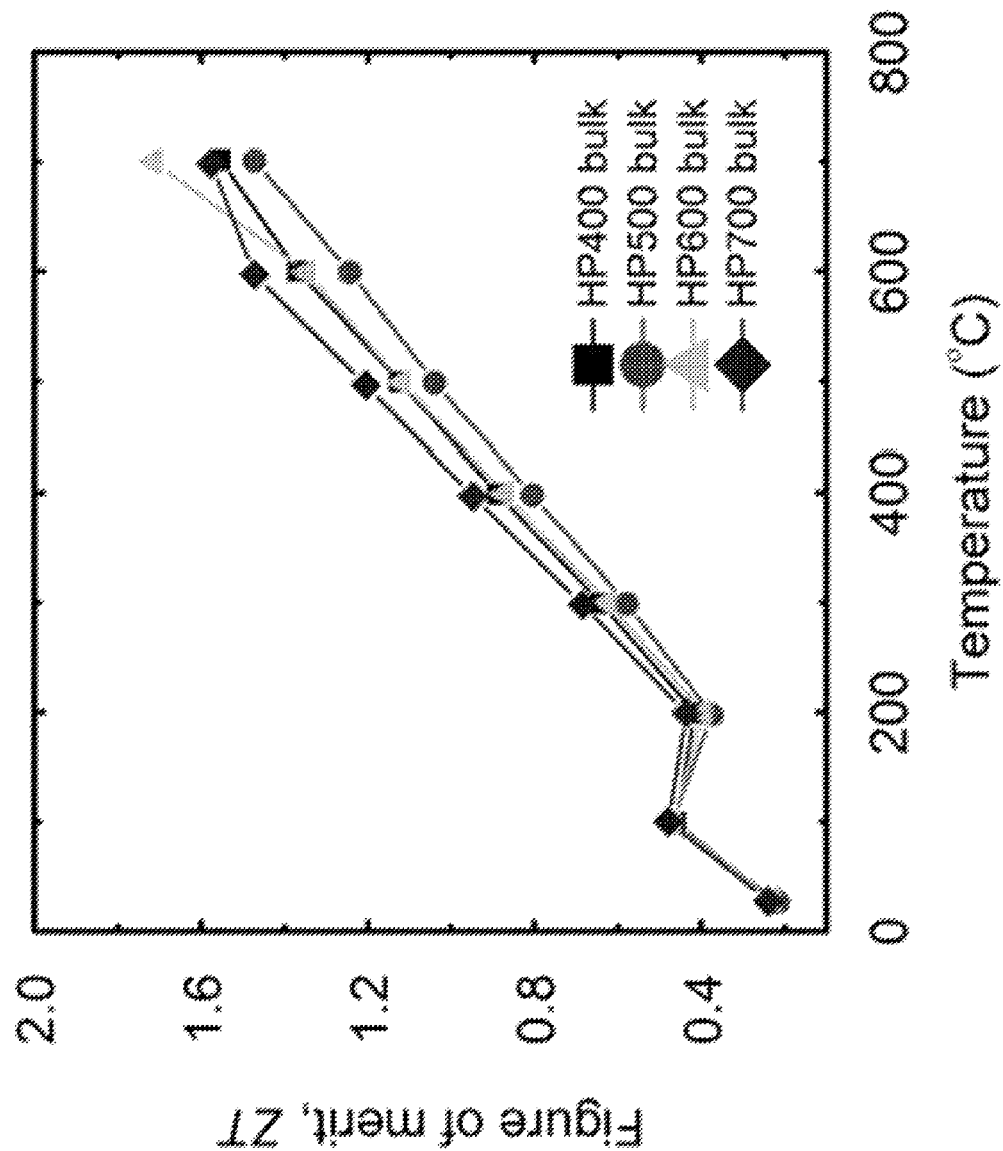
FIG. 3F is a graph showing temperature dependence of Figure-of-merit, ZT, of $Cu_2Se_{1.01}$ bulk samples prepared with different hot pressing temperatures.

The temperature dependent $C_p$ data is shown in FIG. 3D where a λ-shape peak was seen at around 140° C. as a symbol of the phase transition discussed above. Besides this feature, the $C_p$ value is slightly decreasing with the temperature at above 200° C. Those β-phase $Cu_2Se$ samples also possess low total and lattice thermal conductivities, as shown in FIG. 3E, as initially expected from their natural superlattice-like structures, where the lattice thermal conductivity is around 0.4 $Wm^{-1}$ $K^{-1}$ and a total thermal conductivity of less than 1 $Wm^{-1}$ $K^{-1}$ at 700° C. Overall, ZTs of ~1.6 at 700° C. were obtained, as shown in FIG. 3F, which are competitive to other traditional medium temperature thermoelectric materials, such as skutterudites and PbTe, but using abundant and environment-friendly elements. Due to the aforementioned phase transition between tetragonal α-phase and cubic β-phase, a clear change could be observed in all the curves of FIGS. 3A-3F, and this sudden change was found to happen at around 140° C., which is slightly higher than the reported value of 130° C. Furthermore, one may also conclude from FIGS. 3A-3F that the thermoelectric properties of as-prepared $Cu_2Se_{1.01}$ are not sensitive to hot pressing temperature (400° C. to 700° C.).

Figure 4A:
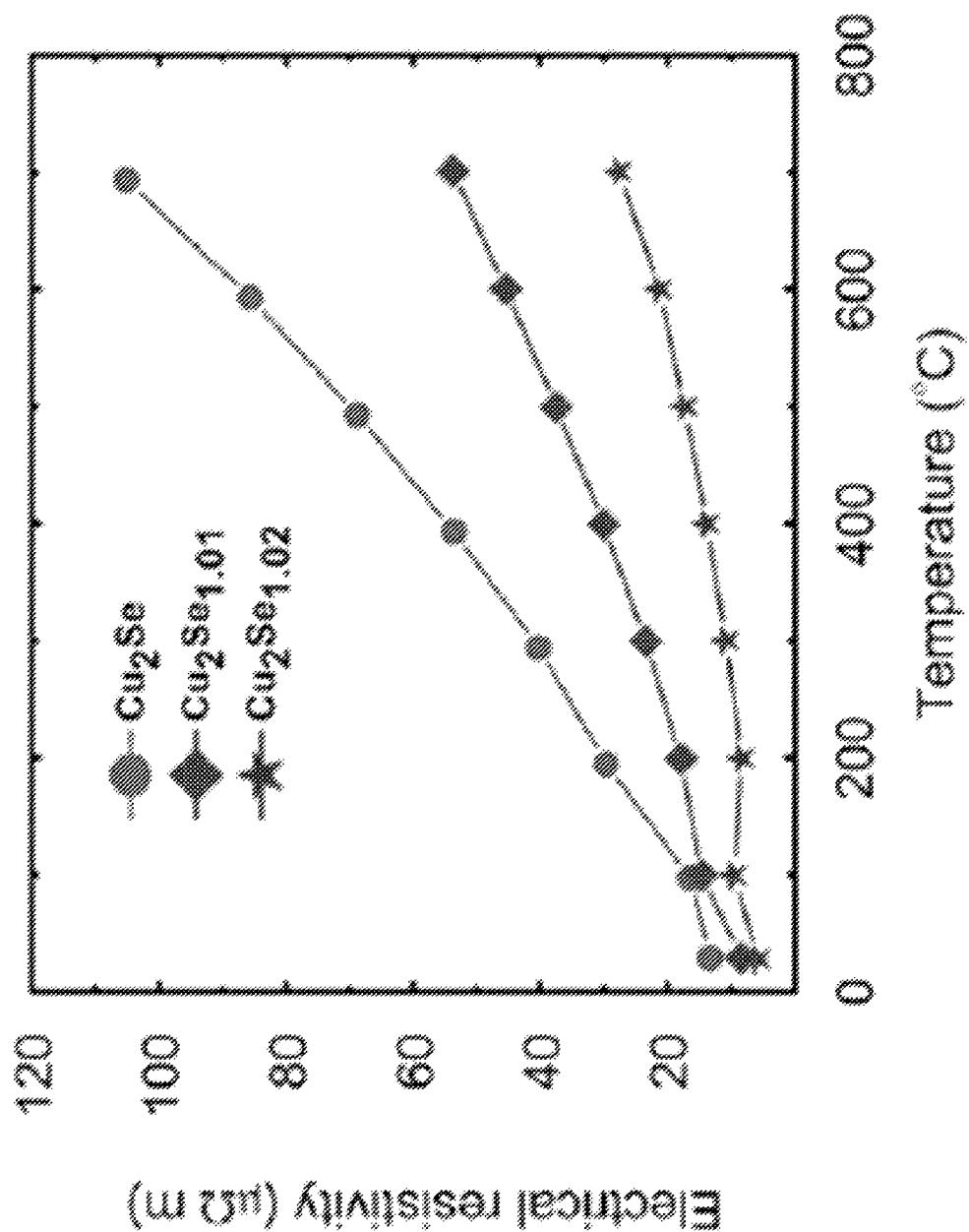
FIG. 4A is a graph showing temperature dependence of electrical resistivity of $Cu_2Se_{1+x}$ with varying selenium content.
Figure 4B:
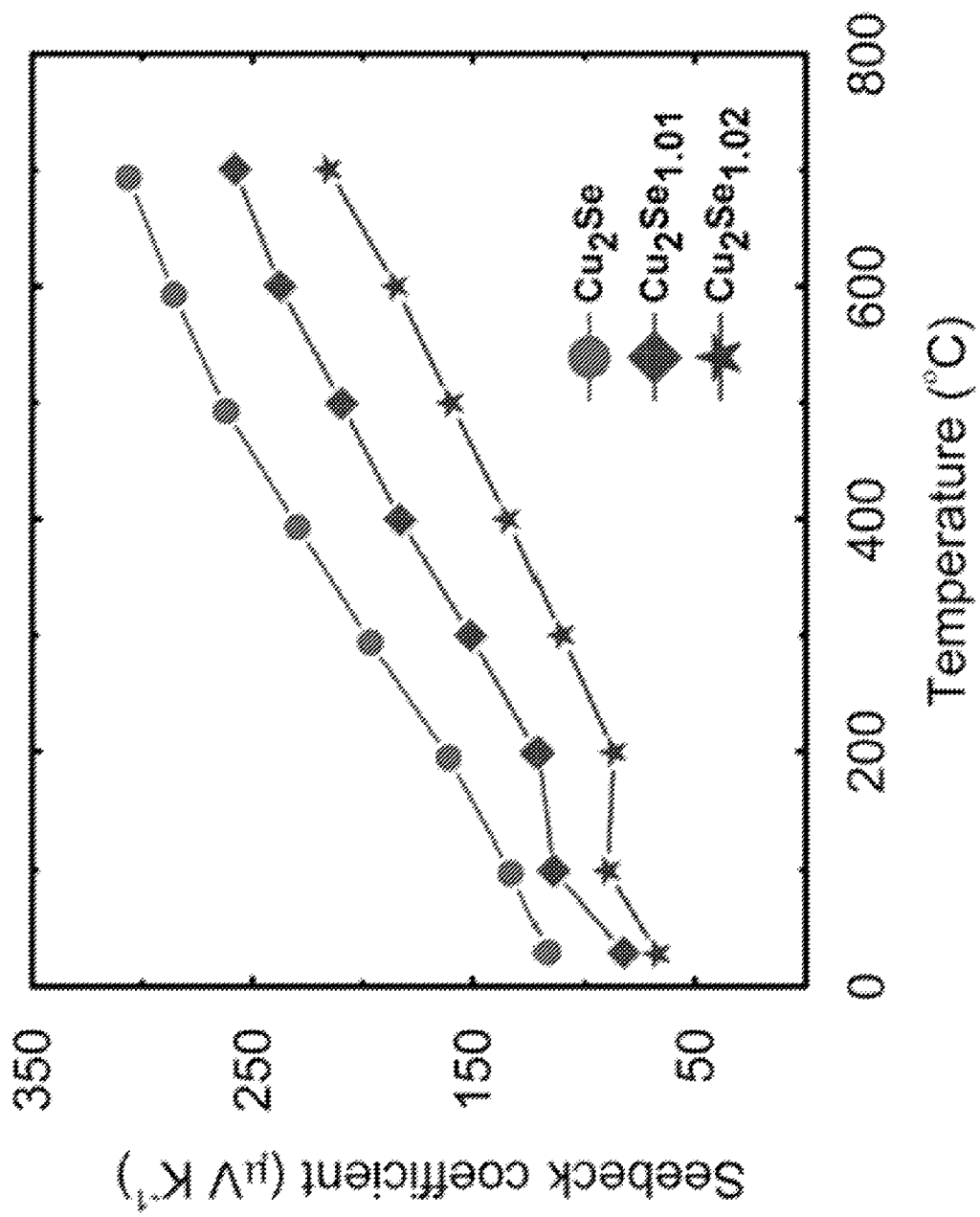
FIG. 4B is a graph showing temperature dependence of Seebeck coefficient of $Cu_2Se_{1+x}$ with varying selenium content.
Figure 4C:
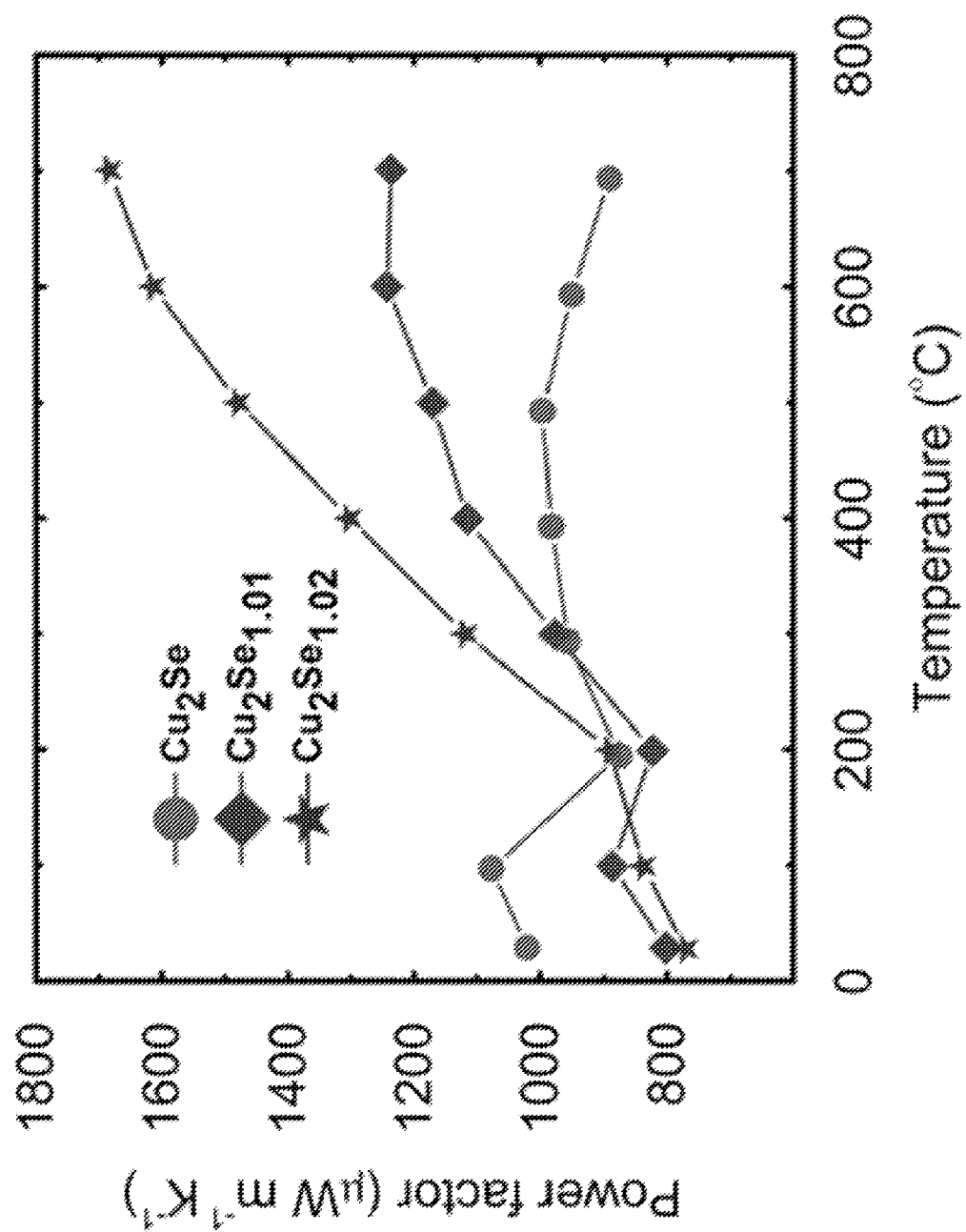
FIG. 4C is a graph showing temperature dependence of power factor of $Cu_2Se_{1+x}$ with varying selenium content.
Figure 4D:
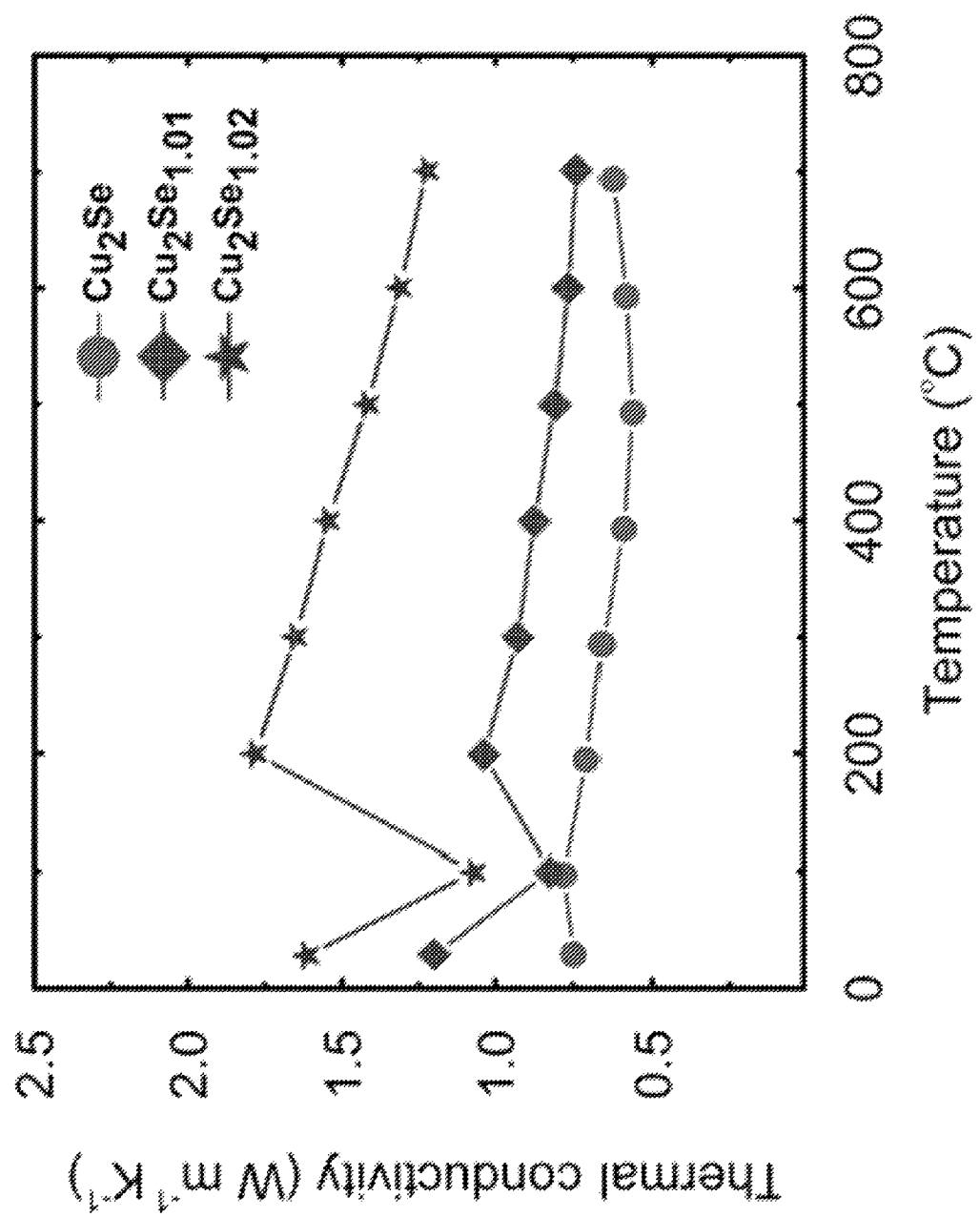
FIG. 4D is a graph showing temperature dependence of thermal conductivity of $Cu_2Se_{1+x}$ with varying selenium content.
Figure 4E:
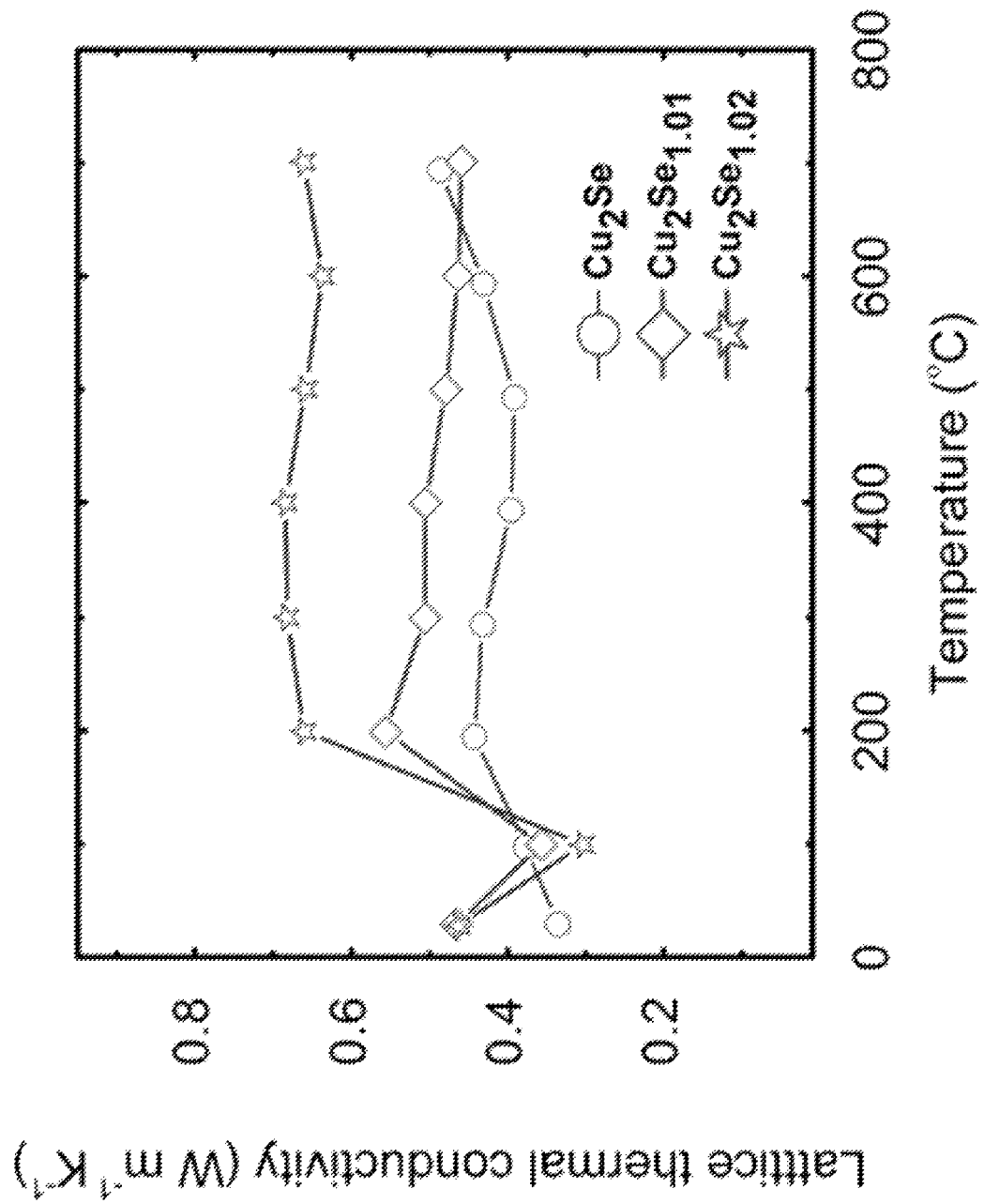
FIG. 4E is a graph showing temperature dependence of lattice thermal conductivity of $Cu_2Se_{1+x}$ with varying selenium content.
Figure 4F:
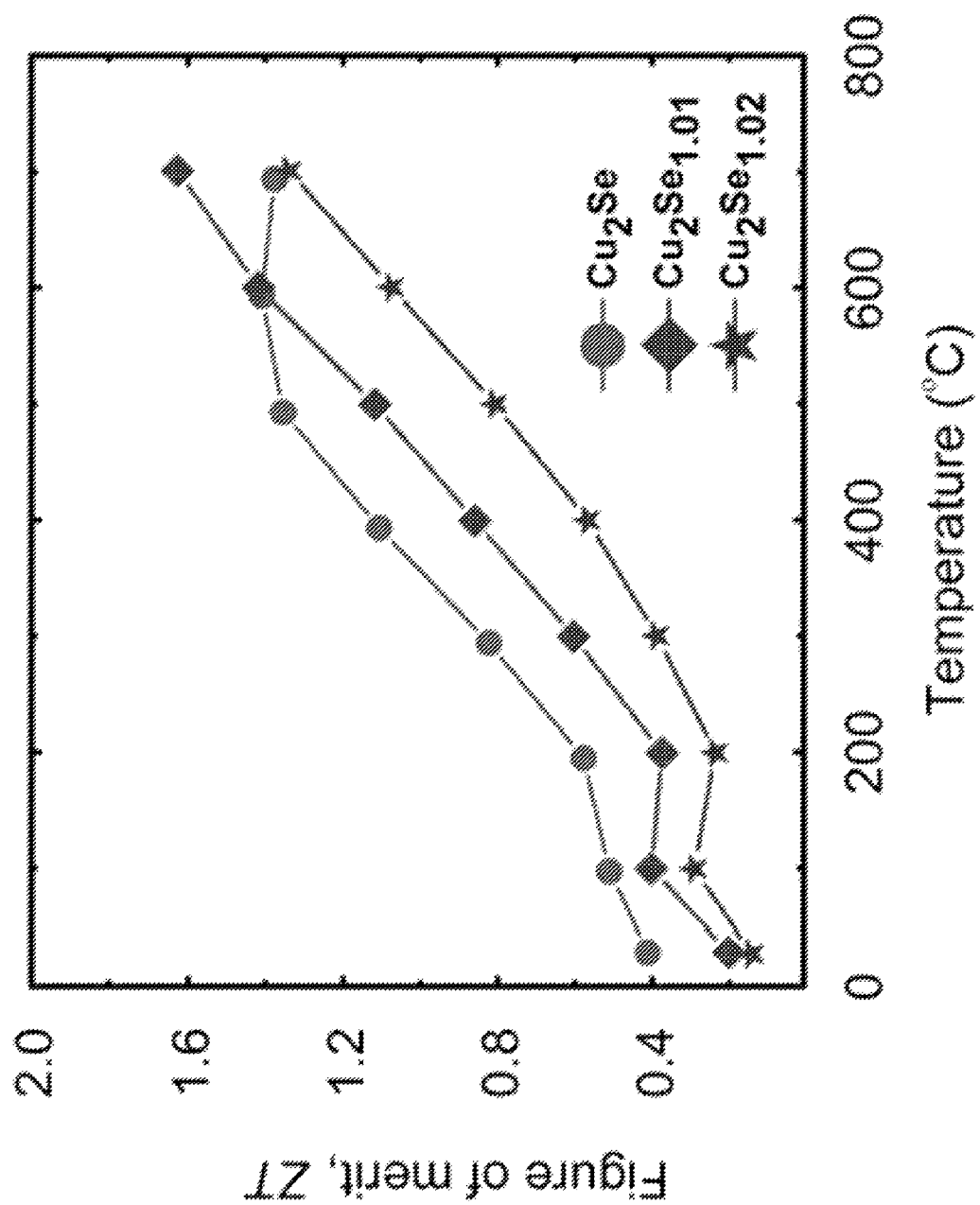
FIG. 4F is a graph showing temperature dependence of figure of merit, ZT, of $Cu_2Se_{1+x}$ with varying selenium content.

The composition effect on the thermoelectric properties of $Cu_2Se_{1+x}$ was also studied by changing the amount of Se in the initial compositions, as shown in FIGS. 4A-4F. For all these samples, hot pressing was performed at 700° C. to make sure that the samples are mechanically strong as the hot-pressing temperature is insensitive to the thermoelectric properties as shown in FIGS. 3A-3F. At any given temperature, both electrical resistivity and Seebeck coefficient, as shown in FIG. 4A and FIG. 4B, decrease with higher selenium content indicating an increased hole concentration due to more Cu vacancies. Accordingly, the $Cu_2Se_{1.02}$ sample has the highest power factor (FIG. 4C) due to its lowest electrical resistivity. FIG. 4D shows the data of temperature dependent thermal conductivity κ while the lattice thermal conductivity $\kappa_{latt}$, shown in FIG. 4E, was calculated by subtracting the carrier contribution $\kappa_{carr}$ from the total κ. The $Cu_2Se_{1.02}$ sample shows not only the highest $\kappa_{carr}$ due to high carrier concentration, but also the highest $\kappa_{latt}$ this series. As for the ZT, as shown in FIG. 4F, the $Cu_2Se_{1.01}$ sample shows the highest peak value of ~1.65 at 700° C., while the highest average ZT appears in $Cu_2Se$ benefiting from its lowest lattice thermal conductivity. From practical application point of view, $Cu_2Se$ is the preferred composition because of the higher average ZT.

The good thermoelectric performance of β-phase $Cu_2Se$ is a direct result of its unique crystal structure as it possesses low lattice thermal conductivity and good power factor at the same time. The disordered Cu atoms at multiple lattice positions in the high temperature β-phase would be a highly efficient phonon scattering mechanism, which is similar to the role of Zn in $Zn_4Sb_3$. On the other hand, the monoatomic Se ordered layer may also introduce disturbance to the phonon propagation. Besides the structure disorder, the abnormal decreasing $C_p$ value at above 200° C. is also worth noting. Normally, the $C_p$ should approach a constant at high temperatures according to Dulong-Petit law or slight increase with temperature due to the thermal expansion of the materials; however, what was observed in the experiments is different: a slightly decreasing $C_p$ with temperature, as shown in FIG. 3D, where similar phenomena were also reported in $Ag_2S$ and $AgCrSe_2$. Anharmonic phonons usually lead to increasing specific heat with increasing temperature although theoretically they can also reduce the specific heat. In the other extreme, many liquids have shown a reducing specific heat as a function of increasing temperature. The random distribution of Cu in β-phase $Cu_2Se$ among several sites along <111> direction could also be considered as a partial melting of Cu atoms, similar to the reported "molten sublattice" in other superionic conductors. Thus it is reasonable to attribute the decreasing specific heat to the increasing anharmonicity in the Cu—Se bonds due to increased random motion of the Cu atoms at high temperature. It is also the reason for the low total and lattice thermal conductivities, as shown in FIG. 3E, in the β-phase $Cu_2Se$ sample.

From the Archimedes' method it is found that the volumetric densities of all the β-phase $Cu_2Se$ samples are similar at ~6.8 g $cm^{-3}$, close to the theoretical value of 6.9~7.0 g $cm^{-3}$, and the SEM study also showed that their typical grain sizes are all in the range of 1-3 μm, as shown in FIG. 2C, which are the reasons for their similar thermoelectric properties regardless the hot pressing temperature. Different from other techniques utilizing nano-inclusions or nano-grains, the good thermoelectric properties of the β-phase $Cu_2Se$ sample mainly relies on its own intrinsic structure features.

Low lattice thermal conductivity of 0.4-0.5 W $m^{-1}$ $K^{-1}$ from room temperature to 700° C. was obtained in β-phase $Cu_2Se$ polycrystals due to a unique combination of monoatomically ordered Se layer and disordered Cu layer in their crystal structure. The increased random motion of Cu atoms results in a slightly decreasing Cp values at above 200° C. A phase transition from a tetragonal α-phase to the FCC β-phase was indicated at around 140° C. in the plots of their thermoelectric transport properties, which was also confirmed by the XRD and HRTEM study at different temperatures. Finally, ZT values of ~1.6 in $Cu_2Se$ and $Cu_2Se_{1.01}$ were achieved in the study, which competes well with other medium temperature thermoelectric materials.

In some embodiments, a method of fabricating a thermoelectric material includes generating a plurality of nanoparticles from a starting material comprising one or more chalcogens and one or more transition metals; and consolidating the nanoparticles under elevated pressure and temperature, wherein the nanoparticles are heated and cooled at a controlled rate.

In some embodiments, a method of producing a thermoelectric material includes generating a plurality of nanoparticles from a starting material comprising selenium and copper; and consolidating the nanoparticles under elevated pressure and temperature, wherein the nanoparticles are heated and cooled at a controlled rate.

In some embodiments, a method of synthesizing a thermoelectric material includes generating a plurality of nanoparticles from a starting material consisting essentially of selenium and copper; heating the plurality of nanoparticles at a controlled rate; consolidating the plurality of nanoparticles under elevated pressure and temperature; and cooling the consolidated plurality of nanoparticles at a controlled rate.

All patents, patent applications, and published references cited herein are hereby incorporated by reference in their entirety. While the methods of the present disclosure have been described in connection with the specific embodiments thereof, it will be understood that it is capable of further modification. Furthermore, this application is intended to cover any variations, uses, or adaptations of the methods of the present disclosure, including such departures from the present disclosure as come within known or customary practice in the art to which the methods of the present disclosure pertain.

What is claimed is:

1. A method of fabricating a thermoelectric material comprising:
   generating a plurality of nanoparticles from a starting material comprising one or more chalcogens and one or more transition metals;
   consolidating the nanoparticles under elevated pressure and temperature, wherein the nanoparticles are heated and cooled at a controlled rate; and
   annealing consolidated nanoparticles at a temperature lower than an elevated temperature of the consolidating step.

2. The method of claim 1 wherein the one or more transition metals are selected from the group consisting of copper, titanium, iron, nickel, and manganese.

3. The method of claim 2 wherein the one or more chalcogens are selected from the group consisting of telluride, selenium and sulfur.

4. The method of claim 1 wherein the starting material consists essentially of selenium (Se) and copper (Cu) in sufficient amount to form $Cu_2Se$.

5. The method of claim 1 wherein the nanoparticles are generated by ball milling.

6. The method of claim 1 wherein the nanoparticles are consolidated by hot pressing.

7. The method of claim 3 wherein the heating step is performed at a rate of about 20° C./min or lower.

8. The method of claim 1 wherein the cooling step is performed at a rate of about 10 20 C./min to about 20° C./min.

9. The method of claim 1 wherein the starting material comprises selenium (Se) and copper (Cu) in an amount according to the stoichiometric formula of $Cu_2Se1+x$ (copper selenides), where x is 0, 0.01, or 0.02.

10. The method of claim 9 wherein the copper selenides are βphase copper selenides.

11. A method of producing a thermoelectric material comprising:
    generating a plurality of nanoparticles from a starting material comprising selenium and copper; and
    consolidating the nanoparticles under elevated pressure and temperature, wherein the nanoparticles are heated and cooled at a controlled rate, wherein the heating step is performed at a rate of about 20° C./min or lower.

12. The method of claim 11 wherein the nanoparticles are generated by ball milling.

13. The method of claim 11 wherein the nanoparticles are consolidated by hot pressing.

14. The method of claim 11 wherein the cooling step is performed at a rate of about 10° C./min to about 20° C./min.

15. The method of claim 11 wherein the selenium (Se) and copper (Cu) are in an amount according to the stoichiometric formula of $Cu_2Se1+x$ (copper selenides), where x is 0, 0.01, or 0.02.

16. The method of claim 15 wherein the copper selenides are βphase copper selenides.

17. The method of claim 11 further comprising annealing consolidated nanoparticles at a temperature lower than an elevated temperature of the consolidating step.

18. A method of fabricating a thermoelectric material comprising:
    generating by ball milling a plurality of nanoparticles from a starting material comprising one or more chalcogens selected from the group consisting of telluride, selenium and sulfur and one or more transition metals selected from the group consisting of copper, titanium, iron, nickel, and manganese;

consolidating the nanoparticles under elevated pressure and temperature, wherein the nanoparticles are heated and cooled at a controlled rate.

19. The method of claim 18 wherein the starting material comprises selenium (Se) and copper (Cu) in sufficient amount to form $Cu_2Se$.

20. The method of claim 18 wherein the heating step is performed at a rate of about 20° C./min or lower.

* * * * *